(12) United States Patent
Min et al.

(10) Patent No.: US 8,466,975 B2
(45) Date of Patent: Jun. 18, 2013

(54) IMAGE PICKUP DEVICES AND METHODS OF PROCESSING IMAGE SIGNALS USING IMAGE PICKUP DEVICES

(75) Inventors: Dong Ki Min, Seoul (KR); Hoon Sang Oh, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 603 days.

(21) Appl. No.: 12/588,444

(22) Filed: Oct. 15, 2009

(65) Prior Publication Data

US 2010/0103294 A1   Apr. 29, 2010

(30) Foreign Application Priority Data

Oct. 24, 2008  (KR) .......................... 10-2008-0104490

(51) Int. Cl.
*H04N 5/225* (2006.01)
*H04N 3/14* (2006.01)

(52) U.S. Cl.
USPC ....................................... 348/219.1; 348/279

(58) Field of Classification Search
USPC ............. 348/219.1, 273, 274, 279, 362
See application file for complete search history.

(56) References Cited

U.S. PATENT DOCUMENTS

| 5,307,170 | A | * | 4/1994 | Itsumi et al. | 348/219.1 |
| 6,236,430 | B1 | * | 5/2001 | Suzuki et al. | 348/219.1 |
| 6,570,613 | B1 | * | 5/2003 | Howell | 348/219.1 |
| 6,670,986 | B1 | | 12/2003 | Shoshan et al. | |
| 2006/0177208 | A1 | | 8/2006 | Ito et al. | |

FOREIGN PATENT DOCUMENTS

| JP | 7-35992 | 2/1995 |
| JP | 2003-224745 | 8/2003 |
| JP | 2008-48388 | 2/2008 |

* cited by examiner

*Primary Examiner* — Timothy J Henn
(74) *Attorney, Agent, or Firm* — Harness, Dickey, Pierce P.L.C.

(57) ABSTRACT

An image pickup device may include a sensor array including a plurality of pixels and an actuator operatively connected to the sensor array. The actuator may be configured to sequentially move the sensor array, in a horizontal or vertical direction by one pixel pitch, in response to a control signal. A method of processing image signals using an image pickup device may include moving the plurality of pixels by the one pixel pitch using the actuator in order to allow multiple pixels to be sequentially located at a position on which light is incident, and sequentially detecting color component signals of each of the multiple pixels from the incident light.

17 Claims, 5 Drawing Sheets

IMAGE PICKUP DEVICES AND METHODS OF PROCESSING IMAGE SIGNALS USING IMAGE PICKUP DEVICES

CROSS-REFERENCE TO RELATED APPLICATION(S)

This application claims priority from Korean Patent Application No. 10-2008-0104490, filed on Oct. 24, 2008, in the Korean Intellectual Property Office (KIPO), the entire contents of which are incorporated herein by reference.

BACKGROUND

1. Field

Example embodiments relate to image processing technology. Also, example embodiments relate to image pickup devices that may improve the quality of images using actuators and/or image processing methods using the same.

2. Description of the Related Art

In general, to detect a full color image, an image sensor may detect single color data for each pixel using a Bayer color filter and/or may perform an interpolation process to interpolate each detected color data using a de-mosaic algorithm. A variety of methods to reduce errors generated during the interpolation process may have been suggested.

SUMMARY

According to example embodiments, image pickup devices may comprise a sensor array, including a plurality of pixels, and/or an actuator operatively connected to the sensor array. The actuator may sequentially move the sensor array in any one of horizontal and vertical directions by one pixel pitch, in response to a control signal.

The actuator may sequentially move the sensor array in any one of horizontal and vertical directions by one pixel pitch, in response to a control signal, in order to allow light incident on any one of the plurality of pixels to be sequentially incident on other pixels (e.g., the rest) of the plurality of pixels.

According to example embodiments, a method of processing an image signal using an image pickup device, that may include a sensor array comprising a plurality of pixels and/or an actuator moving the sensor array by one pixel pitch, may include moving the plurality of pixels using the actuator by one pixel pitch to allow each pixel to be sequentially located at a position on which light is incident, and/or sequentially detecting color component signals of each pixel from the incident light.

According to example embodiments, a method of processing an image signal using an image pickup device, that may include a sensor array comprising first to fourth pixels and/or an actuator moving the sensor array by a pixel pitch, may include detecting a first color component signal of the first pixel from light incident on a particular position, moving the sensor array by the pixel pitch using the actuator to position the second pixel at the particular position, detecting a second color component signal of the second pixel from the incident light, moving the sensor array by the pixel pitch using the actuator to position the third pixel at the particular position, detecting a third color component signal of the third pixel from the incident light, moving the sensor array by the pixel pitch using the actuator to position the fourth pixel at the particular position, and/or detecting a fourth color component signal of the fourth pixel from the incident light.

The method may further include first summing the second color component signal and the fourth color component signal, and second summing a signal according to a result of the first summing, the first color component signal, and the third color component signal.

According to example embodiments, an image pickup device may include a sensor array including a plurality of pixels and/or an actuator operatively connected to the sensor array. The actuator may be configured to sequentially move the sensor array, in a horizontal and/or vertical direction by one pixel pitch, in response to a control signal.

According to example embodiments, the image pickup device may further comprise a microprocessor. The microprocessor may be configured to output the control signal to the actuator.

According to example embodiments, the image pickup device may further comprise an image signal processor. The image signal processor may be configured to receive image signals output from the sensor array. The image signal processor may be configured to output reconfigured image signals based on the received image signals. The received image signals may represent detected color components of light incident on any one of the plurality of pixels. The image signal processor may be configured to output reconfigured image signals based on the detected color components.

According to example embodiments, the sensor array comprises a plurality of 2×2 pixel arrays. Each 2×2 pixel array may comprise a red pixel, a first green pixel, a second green pixel, and/or a blue pixel.

According to example embodiments, a method of processing image signals using an image pickup device, the image pickup device comprising a sensor array including a plurality of pixels and/or an actuator operatively connected to the sensor array, wherein the actuator is configured to sequentially move the sensor array in a horizontal and/or vertical direction by one pixel pitch, may include moving the plurality of pixels by the one pixel pitch using the actuator in order to allow multiple pixels to be sequentially located at a position on which light is incident, and sequentially detecting color component signals of each of the multiple pixels from the incident light.

BRIEF DESCRIPTION OF THE DRAWINGS

The above and/or other aspects and advantages will become apparent and more readily appreciated from the following detailed description of example embodiments, taken in conjunction with the accompanying drawings, in which.

DETAILED DESCRIPTION

Figure 1:
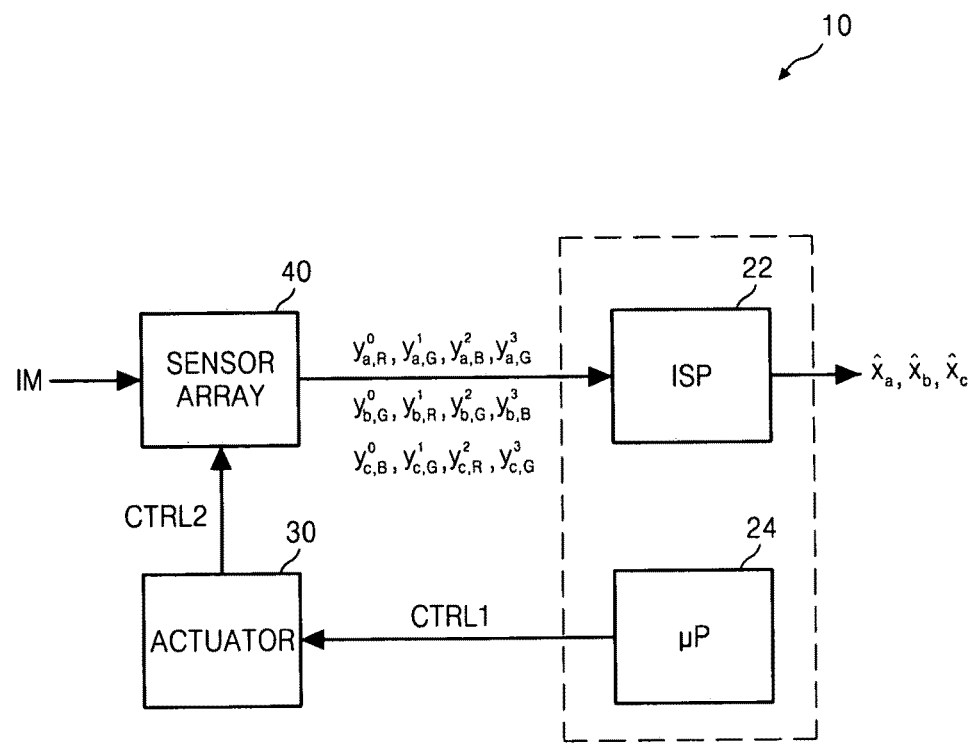
FIG. 1 is a block diagram of an image pickup device according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a block diagram of image pickup device 10 according to example embodiments. Referring to FIG. 1, image pickup device 10, such as an image sensor implemented in a digital camera or a mobile phone, may include image signal processor (ISP) 22, microprocessor (µP) 24, actuator 30, and/or sensor array 40. In the present specification, the image sensor may be an example of image pickup device 10. For example, the image sensor may be one using a complementary metal-oxide semiconductor (CMOS) technology.

Image signal processor 22 may receive image signals output from sensor array 40 and/or may output image signals reconfigured based on the below-described Equations 1-3. The microprocessor 24 may output control signal CTRL1 in order to control operation of actuator 30. For example, image signal processor 22 and microprocessor 24 may be implemented by a single chip or two chips. Actuator 30, in response to control signal CTRL1 output from the microprocessor 24, may provide displacement CTRL2 in order to move sensor array 40 by one pixel pitch. Actuator 30 may include any apparatus(es) that can move sensor array 40 by the pixel pitch.

Sensor array 40 may be moved by the pixel pitch using actuator 30. For example, the pixel pitch may be 1-2 microns (µm). Actuator 30 according to example embodiments may be implemented as a part of an actuator for image stabilization (or, camera shake-stabilization) or as an actuator independent of the actuator for image stabilization (or, camera shake-stabilization). That is, sensor array 40, connected to actuator 30, may be moved using actuator 30 by the pixel pitch in a horizontal and/or vertical direction.

Sensor array 40 may include a plurality of pixels. Each pixel may detect an electrical image signal from optical image signal IM. Since each pixel may transmit to image signal processor 22 the electrical image signal generated by capturing optical image signal IM prior to a settling time, image signal processor 22 may reduce a time to reconfigure a final image signal from the received electrical image signals. Sensor array 40 may include one or more 2×2 Bayer pixel arrays that may be repeatedly implemented.

Figure 2:
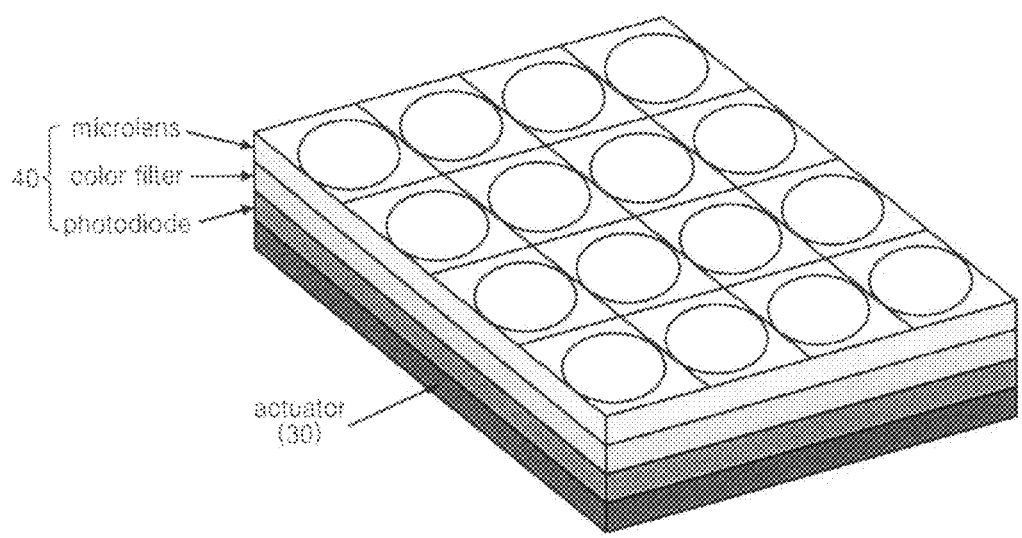
FIG. 2 is a perspective view of the image pickup device of FIG. 1, according to example embodiments.

FIG. 2 is a perspective view of the image pickup device 10 of FIG. 1, illustrating the structure thereof. Referring to FIG. 2, sensor array 40 may include a plurality of pixels. Each of the pixels may be formed in a semiconductor substrate (not shown). Each pixel may include, for example, a photoelectric conversion device performing photoelectric conversion, a color filter formed on the photoelectric conversion device, and/or a microlens formed on the color filter. Each pixel may include, for example, a photoelectric conversion device and/or a microlens.

Photodiodes, phototransistors, and/or pinned photodiodes, for example, may be used as photoelectric conversion devices. The photoelectric conversion device(s) may include a plurality of transistors, for example, three, four, or five transistors. Actuator 30 may be provided under sensor array 40 in order to move or displace sensor array 40 by the pixel pitch in a horizontal direction and/or a vertical direction.

Figure 3:
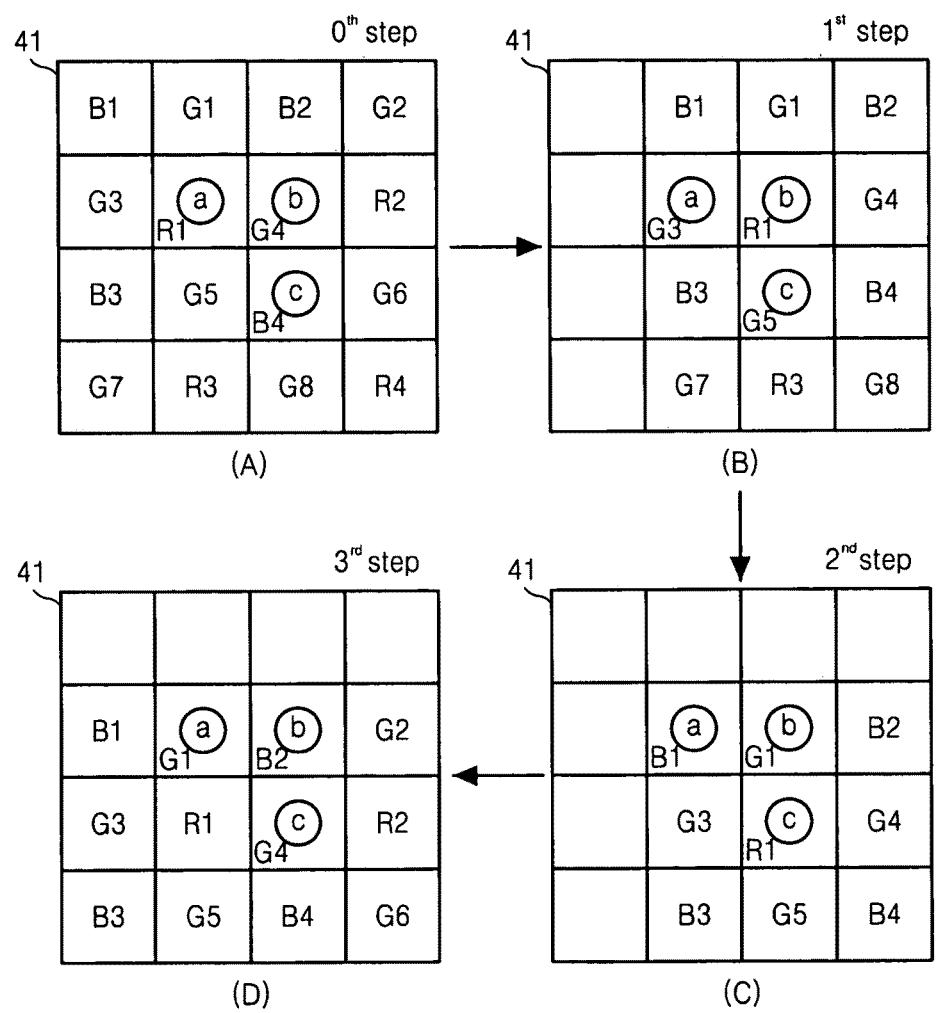
FIG. 3 illustrates movement direction of the sensor array of FIG. 1, according to example embodiments.

FIG. 3 illustrates the movement directions of sensor array 40 of FIG. 1. Referring to FIGS. 1 to 3, a process of detecting color component signals from light incident on a first position (a) while pixel array 41 of sensor array 40 (illustrated for convenience of explanation) may be sequentially moved by actuator 30, by one pixel pitch, is described below.

As illustrated in a diagram (A) of FIG. 3, for example, the $0^{th}$ step, when light is incident on the first position (a) of pixel array 41 in a ready (stop or standby) state, red pixel R1 may detect, or may generate, red component signal $y^0_{a,R}$ and/or may output detected red component signal $y^0_{a,R}$ to image signal processor 22. Pixel array 41 may be moved by actuator 30 to the right by one pixel pitch. Thus, as illustrated in a diagram (B) of FIG. 3, for example, the first step, when the light is incident on the first position (a) of pixel array 41 in the ready state, green pixel G3 may detect green component signal $y^1_{a,G}$ and/or may output detected green component signal $y^1_{a,G}$ to image signal processor 22.

Next, pixel array 41 may be moved by actuator 30 downward by one pixel pitch. Thus, as illustrated in a diagram (C) of FIG. 3, for example, the second step, when the light is incident on the first position (a) of pixel array 41 in the ready state, blue pixel B1 may detect blue component signal $y^2_{a,B}$ and/or may output detected blue component signal $y^2_{a,B}$ to image signal processor 22.

Next, pixel array 41 is moved by actuator 30 to the left by one pixel pitch. Thus, as illustrated in a diagram (D) of FIG. 3, for example, the third step, when the light is incident on the first position (a) of pixel array 41 in the ready state, green pixel G1 may detect green component signal $y^3_{a,G}$ and/or may output detected green component signal $y^3_{a,G}$ to image signal processor 22.

Sensor array 40 including pixel array 41 according to example embodiments may sequentially or simultaneously output the respective detected color component signals to image signal processor 22. Thus, image signal processor 22 may output image signal $\hat{x}_a$ reconfigured (or estimated) using Equation 1 without a separate de-mosaic algorithm.

$$\hat{x}_a = y^0_{a,R} + \frac{1}{2}(y^1_{a,G} + y^3_{a,G}) + y^2_{a,B} \quad \text{[Equation 1]}$$

Referring to FIGS. 1 to 3, a process of detecting color component signals from the light incident on a second position (b) while sensor array 40 is sequentially moved by actuator 30, by one pixel pitch, is described below.

As illustrated in the diagram (A) of FIG. 3, for example, the 0$^{th}$ step, when light is incident on the second position (b) of pixel array 41 in a ready (stop or standby) state, green pixel G4 may detect a green component signal $y^0_{b,G}$ and/or may output detected green component signal $y^0_{b,G}$ to image signal processor 22. Pixel array 41 may be moved by actuator 30 to the right by one pixel pitch. Thus, as illustrated in the diagram (B) of FIG. 3, when the light is incident on the second position (b) of pixel array 41 in the ready state, red pixel R1 may detect red component signal $y^1_{b,R}$ and/or may output detected red component signal $y^1_{b,R}$ to image signal processor 22.

Next, pixel array 41 may be moved by actuator 30 downward by one pixel pitch. Thus, as illustrated in the diagram (C) of FIG. 3, when the light is incident on the second position (b) of pixel array 41 in the ready state, green pixel G1 may detect green component signal $y^2_{b,G}$ and/or may output detected green component signal $y^2_{b,G}$ to image signal processor 22.

Next, pixel array 41 may be moved by actuator 30 to the left by one pixel pitch. Thus, as illustrated in the diagram (D) of FIG. 3, when the light is incident on the second position (b) of pixel array 41 in the ready state, blue pixel B2 may detect blue component signal $y^3_{b,B}$ and/or may output detected green component signal $y^3_{b,B}$ to image signal processor 22.

Image signal processor 22 may output image signal $\hat{x}_b$, reconfigured (or estimated) using Equation 2 without the separate de-mosaic algorithm.

$$\hat{x}_b = y^1_{b,R} + \frac{1}{2}(y^0_{b,G} + y^2_{b,G}) + y^3_{b,B} \quad \text{[Equation 2]}$$

Since a process of detecting color component signals from the light incident on a third position (c) while sensor array 40 is sequentially moved by actuator 30, by one pixel pitch, is the same or similar to the process of detecting color component signals from the light incident on the first position (a) and the process of detecting color component signals from the light incident on the second position (b), a detailed description thereon will be omitted.

Thus, image signal processor 22 may output image signal $\hat{x}_c$ reconfigured (or estimated) using Equation 3 without the separate de-mosaic algorithm.

$$\hat{x}_c = y^0_{c,B} + \frac{1}{2}(y^1_{c,G} + y^3_{c,G}) + y^2_{c,R} \quad \text{[Equation 3]}$$

Movement directions of sensor array 40 according to example embodiments are illustrated in the diagrams (A) of FIG. 3 to (D) of FIG. 3.

Figure 4:
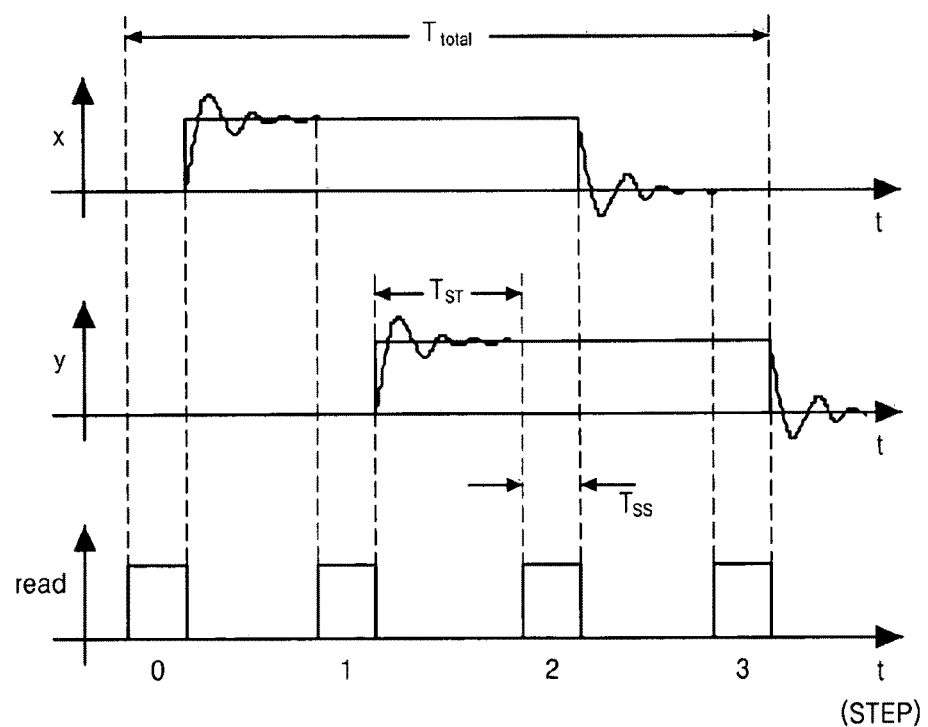
FIG. 4 is a graph illustrating final image detection times of the image sensor of FIG. 1, according to example embodiments.

FIG. 4 is a graph illustrating the final image detection time of image sensor of FIG. 1. Referring to FIG. 4, when sensor array 40 may be moved by actuator 30 by one pixel pitch, a settling time is $T_{ST}$. When an image detection time corresponding to a shutter speed of the image sensor is $T_{SS}$, final image detection time $T_{total}$ may be shown in the following equation. In the graph of FIG. 4, while "x" on the horizontal axis denotes a movement distance of sensor array 40 in a direction along the x-axis, "y" on the vertical axis denotes a movement distance of sensor array 40 in a direction along the y-axis.

$$T_{total} = 3*T_{ST} + 4*T_{SS} \quad \text{[Equation 4]}$$

Figure 5:
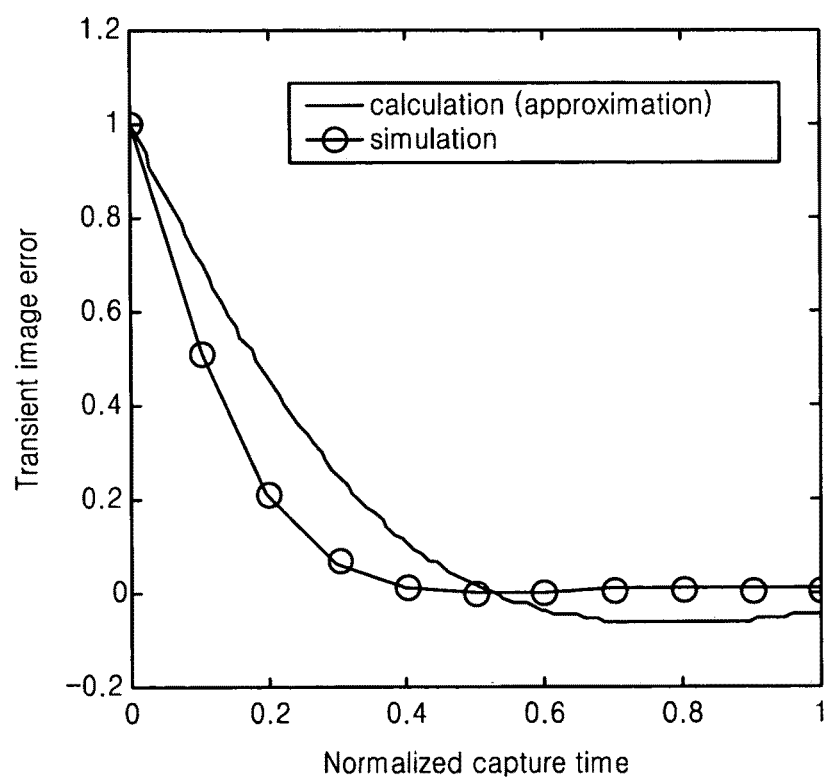
FIG. 5 is a graph illustrating the relationship between transient image error and capture time of the image sensor of FIG. 1, according to example embodiments.

FIG. 5 is a graph illustrating the relationship between the transient image error and the normalized capture time of the image sensor of FIG. 1. Image pickup device 10 may detect optical image signal IM before settling time $T_{ST}$ in order to reduce final image detection time $T_{total}$, as expressed in Equation 4. When optical image signal IM is to be detected at, for example, one half of settling time $T_{ST}$, the transient image error may be reduced. In other words, as shown in FIG. 5, optical image signal IM may be detected at a time before settling time $T_{ST}$, but the transient image error may still be reduced. The transient image error may denote a difference between a real image and an image restored by image signal processor 22. That is, as expressed in Equation 4, the input image may be detected before settling time $T_{ST}$ to reduce final image detection time $T_{total}$.

Image signal processor 22 according to example embodiments may be implemented by hardware for performing Equations 1 to 3 and/or by software for performing Equations 1 to 3.

While example embodiments have been particularly shown and described, it will be understood by those of ordinary skill in the art that various changes in form and details may be made therein without departing from the spirit and scope of the present invention as defined by the following claims.

What is claimed is:

1. An image pickup device, comprising:
   a sensor array including a plurality of pixels; and
   an actuator operatively connected to the sensor array;
   wherein the actuator is configured to sequentially move the sensor array, in a horizontal or vertical direction by one pixel pitch, in response to a control signal,
   wherein the image pickup device is configured to sequentially detect color component signals of each of the plurality of pixels before a settling time of the sensor array,
   wherein the sensor array includes first to fourth pixels,
   wherein the actuator and the image pickup device are further configured to alternately move the sensor array and detect the color component signals, so that:

the image pickup device detects a first color component signal of the first pixel from light incident on a particular position;

the sensor array moves by the one pixel pitch using the actuator to dispose the second pixel at the particular position;

the image pickup device detects a second color component signal of the second pixel from the incident light;

the sensor array moves by the one pixel pitch using the actuator to dispose the third pixel at the particular position;

the image pickup device detects a third color component signal of the third pixel from the incident light;

the sensor array moves by the one pixel pitch using the actuator to dispose the fourth pixel at the particular position; and the image pickup device detects a fourth color component signal of the fourth pixel from the incident light;

wherein the image pickup device is further configured to first sum the second color component signal and the fourth color component signal, and wherein the image pickup device is further configured to second sum a signal according to a result of the first summing, the first color component signal, and the third color component signal.

2. The image pickup device of claim 1, wherein the actuator sequentially moves the sensor array in the horizontal direction by one pixel pitch, in the vertical direction by one pixel pitch, and in the horizontal direction by one pixel pitch.

3. The image pickup device of claim 1, wherein each pixel comprises:
a photoelectric conversion device; and
a microlens.

4. The image pickup device of claim 3, wherein the photoelectric conversion device comprises:
one or more photodiodes;
one or more pinned photodiodes;
one or more transistors; or
one or more phototransistors.

5. The image pickup device of claim 1, wherein each pixel comprises:
a photoelectric conversion device;
a color filter; and
a microlens.

6. The image pickup device of claim 5, wherein the photoelectric conversion device comprises:
one or more photodiodes;
one or more pinned photodiodes;
one or more transistors; or
one or more phototransistors.

7. The image pickup device of claim 1, further comprising:
a microprocessor;
wherein the microprocessor is configured to output the control signal to the actuator.

8. The image pickup device of claim 1, further comprising:
an image signal processor;
wherein the image signal processor is configured to receive image signals output from the sensor array.

9. The image pickup device of claim 8, wherein the image signal processor is configured to output reconfigured image signals based on the received image signals.

10. The image pickup device of claim 8, wherein the received image signals represent the sequentially detected color component signals.

11. The image pickup device of claim 10, wherein the image signal processor is configured to output reconfigured image signals based on the sequentially detected color component signals.

12. The image pickup device of claim 1, wherein the sensor array comprises a plurality of 2×2 pixel arrays.

13. The image pickup device of claim 12, wherein each of the 2×2 pixel arrays comprises:
a red pixel;
a first green pixel;
a second green pixel; and
a blue pixel.

14. A method of processing image signals using an image pickup device, the image pickup device comprising a sensor array including a plurality of pixels and an actuator operatively connected to the sensor array, wherein the actuator is configured to sequentially move the sensor array in a horizontal or vertical direction by one pixel pitch, the method comprising:

moving the plurality of pixels by the one pixel pitch using the actuator in order to allow multiple pixels to be sequentially located at a position on which light is incident; and sequentially detecting color component signals of each of the multiple pixels from the incident light;

wherein in the sequentially detecting of color component signals, the color component signals are sequentially detected before a settling time of the sensor array, and wherein the sensor array includes first to fourth pixels, and wherein moving the plurality of pixels by the one pixel pitch and sequentially detecting color component signals alternate, the method further comprising:

detecting a first color component signal of the first pixel from the incident light on a particular position;

moving the sensor array by the one pixel pitch using the actuator to dispose the second pixel at the particular position;

detecting a second color component signal of the second pixel from the incident light;

moving the sensor array by the one pixel pitch using the actuator to dispose the third pixel at the particular position;

detecting a third color component signal of the third pixel from the incident light;

moving the sensor array by the one pixel pitch using the actuator to dispose the fourth pixel at the particular position;

detecting a fourth color component signal of the fourth pixel from the incident light;

first summing the second color component signal and the fourth color component signal; and second summing a signal according to a result of the first summing, the first color component signal, and the third color component signal.

15. The method of claim 14, wherein the first pixel is a red pixel of a 2×2 pixel array,
wherein the second pixel is a first green pixel of the 2×2 pixel array,
wherein the third pixel is a blue pixel of the 2×2 pixel array, and
wherein the fourth pixel is a second green pixel of the 2×2 pixel array.

16. The method of claim 14, wherein the sensor array comprises a plurality of 2×2 pixel arrays.

17. The method of claim 16, wherein each of the 2×2 pixel arrays comprises:
a red pixel;

a first green pixel;
a second green pixel; and
a blue pixel.

* * * * *